United States Patent
Rice et al.

(10) Patent No.: US 6,556,602 B2
(45) Date of Patent: Apr. 29, 2003

(54) ELECTRON BEAM PUMPED SEMICONDUCTOR LASER SCREEN AND ASSOCIATED FABRICATION METHOD

(75) Inventors: Robert Rex Rice, Simi Valley, CA (US); Neil F. Ruggieri, St. Louis, MO (US); J. Stanley Whiteley, Maryland Heights, MO (US); Robert A. Morgan, Plymouth, MN (US); Richard A. Skogman, Plymouth, MN (US)

(73) Assignee: The Boeing Company, Seattle, WA (US)

( * ) Notice: Subject to any disclaimer, the term of this patent is extended or adjusted under 35 U.S.C. 154(b) by 0 days.

(21) Appl. No.: 09/730,286

(22) Filed: Dec. 5, 2000

(65) Prior Publication Data

US 2002/0067750 A1 Jun. 6, 2002

(51) Int. Cl.[7] .................................................. H01S 5/00
(52) U.S. Cl. .......................................... 372/43; 372/45
(58) Field of Search ............................. 372/43, 73, 74; 313/463

(56) References Cited

U.S. PATENT DOCUMENTS

| | | |
|---|---|---|
| 4,539,687 A | 9/1985 | Gordon et al. |
| 4,695,332 A | 9/1987 | Gordon et al. |
| 5,254,502 A | 10/1993 | Kozlovsky |
| 5,280,360 A | 1/1994 | Derdyra et al. |
| 5,283,798 A | 2/1994 | Kozlovsky et al. |
| 5,313,483 A | 5/1994 | Kozlovsky et al. |
| 5,317,583 A | 5/1994 | Nasibov et al. |
| 5,339,003 A | 8/1994 | Kozlovsky et al. |
| 5,374,870 A | 12/1994 | Akhekyan et al. |
| 5,677,923 A | 10/1997 | Rice et al. |
| 5,687,185 A | 11/1997 | Kozlovsky et al. |
| 5,841,802 A | 11/1998 | Whiteley et al. |
| 6,044,100 A * | 3/2000 | Hobson et al. ............... 372/46 |

* cited by examiner

*Primary Examiner*—Quyen Leung
*Assistant Examiner*—Armando Rodriquez
(74) *Attorney, Agent, or Firm*—Alston & Bird LLP (57) ABSTRACT

An electron beam pumped semiconductor laser screen and an associated fabrication method are described which provide a display screen that has a relatively long operating lifetime, is less expensive to produce, and operates at lower electron voltages and near room temperature conditions. The laser screen includes a multi quantum well active gain region having quantum wells of GaInP and barrier layers of $(Al_xGa_{1-x})InP$, thereby permitting operation in the visible, red spectrum. Moreover, the first layer epitaxially grown on the sacrificial substrate is an etch stop layer of $(Ga_xAl_{1-x})_yIn_{1-y}P$ that acts as an etch stop during the subsequent etching of the sacrificial substrate and may also be used to adjust the cavity length to the correct resonance condition. The laser screen also includes an output mirror having alternating layers of two different compositions of $Ga_xAl_{1-x}As$ that are epitaxially grown on the multi quantum well active gain region. The output mirror can also include a thin, final layer of GaAs to cap the structure and prevent degradation of the $Ga_xAl_{1-x}As$ layers. The semiconductor laser screen also includes a carrier that is affixed to the output mirror. Further, the laser screen includes a metallic mirror and, in one embodiment, a hybrid metallic-dielectric mirror on the etch stop layer opposite the output mirror. As such, a laser cavity is defined between the output mirror and the metallic mirror. The semiconductor laser screen may be integrated into an electron beam pumped semiconductor laser which forms the basis for a projection display. A fabrication method is also provided.

18 Claims, 4 Drawing Sheets

ELECTRON BEAM PUMPED SEMICONDUCTOR LASER SCREEN AND ASSOCIATED FABRICATION METHOD

GOVERNMENT RIGHTS

This invention was made with government support under contract no. DAB-T63-93-C-0047 awarded by the Advanced Research Projects Agency. Accordingly, the government may have certain rights in the invention.

FIELD OF THE INVENTION

This invention relates to semiconductor lasers and, more particularly, to an electron beam pumped semiconductor laser screen and method of producing the electron beam pumped semiconductor laser screen.

BACKGROUND OF THE INVENTION

Large displays are becoming more popular with the prevalence of computer technologies. These large displays can present substantial quantities of information. For example, large displays that are bright and that offer very clear image quality are desirable in training and simulation systems for commercial and military aircraft. In addition, large displays are useful for a number of other commercial applications.

The common large area displays known today are based upon cathode ray tube (CRT) technology and have many drawbacks. The most significant disadvantage is the limited amount of light that can be generated behind the screen, which results in the display being dim and having poor color saturation for large areas. To address this problem, electron beam pumped semiconductor laser (EBSL) displays were developed to create large, bright, full color projector displays similar to the projection displays of phosphor-based CRTs. By substituting a semiconductor laser screen for the phosphor screen, exceptional image quality over theater-sized screens is produced and can be used in applications such as flight simulators, cockpit displays, electronic cinema, teleconferencing, auditorium displays, laser microscopy, optical computing, and theme park laser displays.

Conventional laser screens for EBSL displays are constructed from large, circular wafers cut from a single crystal ingot of a II–VI alloy, such as Cadmium Sulphide (CdS), Cadmium Selenide (CdSe) or Zinc Selenide (ZnSe). Typically, these wafers are 50 mm or less in diameter and approximately 1 mm in thickness. After the wafer is cut, one surface is polished to an optically perfect finish and appropriate dielectric mirror coatings are applied. The polished and coated surface is bonded to a polished sapphire substrate with an optically transparent cement and the wafer is then thinned to about 1–10 microns by lapping the exposed surface, opposite the sapphire substrate. Next, the lapped surface is polished to optical perfection, such that the wafer has uniform thickness and a smooth surface. This surface is coated with a metallic mirror film that provides an optical reflector and an electron beam current return path. Then the processed wafer may be utilized as a laser screen for an EBSL display by attaching the laser to the body of a CRT, which is evacuated for operation.

Unfortunately, the resulting EBSL displays have several disadvantages. In this regard, the cost and yield of the displays are unattractive because the process of polishing and coating the wafer requires extensive mechanical handling of the extremely fragile II–VI wafers, which are prone to damage. Because of the thickness of the single crystal wafer, very high electron beam voltages (greater than 60 kV) are required for operation. This high electron beam voltage results in the local generation of large amounts of heat, which reduces the operating lifetime of the screen, such as to less than 1000 hours. In addition, because the screens must typically be operated at cryogenic temperatures, i.e., less than 100 K, cryogenic cooling is needed. The high electron beam voltage may also lead to the production of hazardous X-rays, which requires that the laser be extensively shielded.

Large-size screens that incorporate conventional EBSL displays also have drawbacks. Besides the fact that the size of the screen is limited by the size of the single crystal wafer that can be grown, the cost and yield of producing the large, bulk single crystals of II–VI materials may be prohibitive because they are difficult and expensive to grow and fabricate, as described above. Moreover, the resolution of the large area displays is often poor because uniformity of the wafer thickness may be difficult to obtain during polishing, which results in undesirable variations in the laser output at different positions across the screen. Accordingly, while an EBSL screen offers a number of performance advantages for large displays, conventional EBSL screens are generally prohibitively expensive due to their low yield during fabrication and the cost of the cryogenic cooling and shielding that is typically required to support the high electron beam pumped voltages and the attendant high temperature operation.

SUMMARY OF THE INVENTION

These and other shortcomings are overcome by the electron beam pumped semiconductor laser screen and the associated fabrication method of the present invention, which provide a display screen that has a relatively long operating lifetime, is less expensive to produce, and operates at lower electron voltages and near room temperature conditions. In general terms, a semiconductor laser screen is provided that includes a laser cavity, which is defined by a metallic mirror and opposed epitaxially grown output mirror layers. The semiconductor laser cavity also includes a multi quantum well active gain region and an etch stop layer which may also permit the cavity to be tailored so as to support resonance at a wavelength that matches the optical gain of the epitaxially grown multi quantum well active gain region.

The multi quantum well active gain region is typically grown epitaxially on a sacrificial substrate, such as a single crystal GaAs substrate, in order to obtain high quality, lattice matched epitaxial layers. In a preferred embodiment, the layers consist of quantum wells of GaInP and barrier layers of $(Al_xGa_{1-x})InP$, such as $Al_{0.4}Ga_{0.6}InP$, so as to advantageously operate in the visible, red spectrum. Moreover, the first layer epitaxially grown on the sacrificial substrate is an etch stop layer of $(Ga_{1-x}Al_x)_yIn_{1-y}P$, such as GaInP, that serves two purposes: (1) to act as an etch stop during the subsequent chemical etching of the sacrificial substrate, and (2) to adjust the cavity length to the correct resonance conditions by tuning the cavity length to precisely match the optical gain profile.

The output mirror is comprised of alternating layers of a first $Ga_xAl_{1-x}As$ composition and a second $Ga_xAl_{1-x}As$ composition, such as alternating layers of AlAs and $Ga_{0.5}Al_{0.5}As$, that are epitaxially grown on the multi quantum well active gain region. The output mirror can also include a thin, final layer of GaAs to cap the structure and prevent degradation of the $Ga_xAl_{1-x}As$ layers. The reflectivity of the output mirror depends on the number of layers and upon the wavelength of the light, so structures can be designed and fabricated for a wide variety of wavelengths and reflectivities.

The gain layers and the output mirror are grown using epitaxial growth techniques such as metal organic chemical vapor deposition (MOCVD), Metal Organic Vapor Phase Epitaxy (MOVPE) or molecular beam epitaxy (MBE). These epitaxial growth techniques are advantageous because they are capable of the extremely high precision in the control of layer thickness required in this structure and they provide for more uniform wafer thickness than in conventional designs and thus, better resolution of the large area displays.

The semiconductor laser screen also includes a carrier that is affixed to and supports the output mirror. Further, the semiconductor laser screen includes a metallic mirror and, in one embodiment, a hybrid metallic-dielectric mirror, on the etch stop layer opposite the output mirror. As such, a laser cavity is defined between the output mirror and the metallic mirror. The metallic mirror is thin so as to permit electrons to penetrate therethrough in order to pump the multi quantum well active gain region. The semiconductor laser screen will then emit light in the red portion of the visible spectrum.

In order to fabricate the semiconductor laser screen, the epitaxially grown gain and output mirror layers are bonded to the optically transparent carrier. The carrier commonly chosen for screens is sapphire, although other materials could also be used as long as they are optically transparent, mechanically strong, and are chemically inert during the subsequent fabrication steps. An optically transparent adhesive or wafer fusion is preferably used to bond the epitaxial structure to the carrier, which will allow the emitted laser beam to pass through with little attenuation.

The sacrificial substrate upon which the gain and output mirror layers were grown is then removed by using a combination of mechanical polishing followed by chemical etching until the etch stop layer is exposed. During the chemical etching, the etch stop layer can also be etched, and may be completely removed, to precisely control the thickness of the resulting laser cavity. The metallic mirror that defines one end of the laser cavity is then deposited on the etch stop layer.

The semiconductor laser screen may be integrated into an electron beam pumped semiconductor laser, such as a cathode ray tube (CRT), which forms the basis for a projection display. This laser also includes an electron beam source for generating an electron beam that impinges upon the semiconductor laser screen in such a manner that at least some electrons of the electron beam penetrate the metallic mirror and pump the multi quantum well active gain region to generate lasing in the red spectrum. The laser further includes an evacuated tube such that the semiconductor laser screen and electron beam source are positioned at opposite ends and a deflector is positioned between them for controllably deflecting the electron beam. As such, a semiconductor laser screen can therefore be reliably fabricated according to the present invention that emits light in the red portion of the visible spectrum. As a result of its construction, the semiconductor laser screen need not consume as much power as is required for conventional laser screens, thereby permitting operation at or near room temperature and providing a relatively long operational lifetime.

BRIEF DESCRIPTION OF THE DRAWINGS

Having thus described the invention in general terms, reference will now be made to the accompanying drawings, which are not necessarily drawn to scale, and wherein:

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
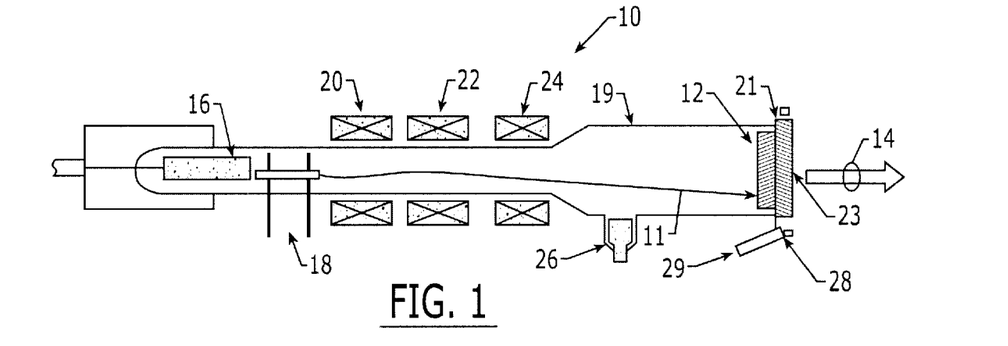
FIG. 1 is a schematic representation of a electron beam pumped semiconductor laser according to one embodiment of the present invention.

An electron beam pumped semiconductor laser 10 according to the present invention is illustrated in FIG. 1. As shown, an electron beam 11 is generated and accelerated to impinge a semiconductor laser screen 12, thereby generating an output laser beam 14. The electron beam is typically generated by an electron gun 16 in combination with a bias and acceleration grid 18. The electron gun is generally disposed at the opposite end of an evacuated housing 19, such as a cathode ray tube, from the semiconductor laser screen. As shown, the semiconductor laser screen can be mounted to the housing by means of a face plate/interface flange 21 in order to form a semiconductor laser screen assembly 23. The electron beam is scanned across the semiconductor laser screen and is controlled by the focus yokes 20, alignment yokes 22, and X-Y deflection yokes 24. In addition, the semiconductor laser may include a vacuum pump 26, such as an ion pump, for maintaining a vacuum within the housing, and a cooling manifold 28 including a coolant port 29 for cooling the laser screen.

Figure 2:
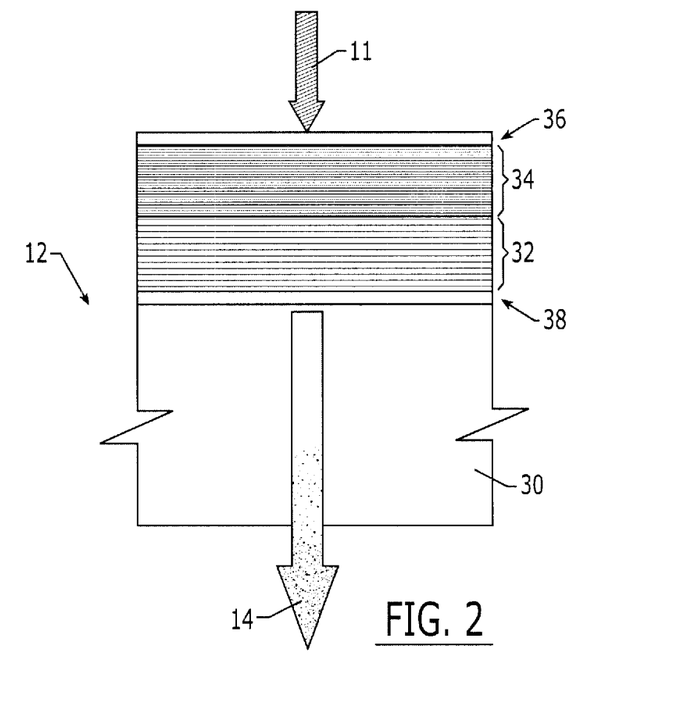
FIG. 2 is a greatly enlarged cross sectional view of an electron beam pumped semiconductor laser screen according to one embodiment of the present invention.

As shown in FIG. 2, the laser screen 12 includes a carrier 30, an output mirror 32 having a plurality of layers disposed on the carrier, a multi quantum well active gain region 34 disposed on the output mirror, and a thin, highly reflective mirror 36 disposed on the active gain region. Accordingly, the two mirrors 32 and 36 define a laser cavity, between which the active gain region is sandwiched. In operation, the incident electron beam 11 generates an output laser beam 14 at the point of impingement with the active gain region. Thus, the highly reflective mirror is thin enough that the electron beam is not significantly impeded thereby such that a majority of the electrons pass through the mirror and into the active gain region where carrier recombination takes place to produce an output laser beam.

The carrier 30 is preferably transparent at the wavelength of the output laser beam 14, sufficiently strong to provide mechanical integrity for the thinner active gain region 34 and the output mirror 32, and chemically inert to the fabrication process. Moreover, the carrier is preferably a single crystal material. In one embodiment, the carrier is a relatively thick (0.1 mm to 1 cm) sapphire (single crystal $Al_2O_3$) carrier plate, although carriers formed of other materials would function as well. As described below in conjunction with the fabrication of the electron-beam pumped semiconductor laser screen 12, an optically transparent adhesive 38 may be used to bond the output mirror to the carrier so as not to attenuate the electron beam 11. The adhesive must be capable of withstanding the temperatures and vacuum conditions to which the laser screen may be subjected and, in one embodiment, is Lens Bond UV74 or J91 from Summers Laboratories, although other adhesives may also be employed. An alternative to the adhesive is to fuse the carrier and the output mirror without any adhesive. In this regard, water fusion would bond the carrier to the output mirror via inter-atomic diffusion so as to form an intimate bond therebetween.

Figure 3:
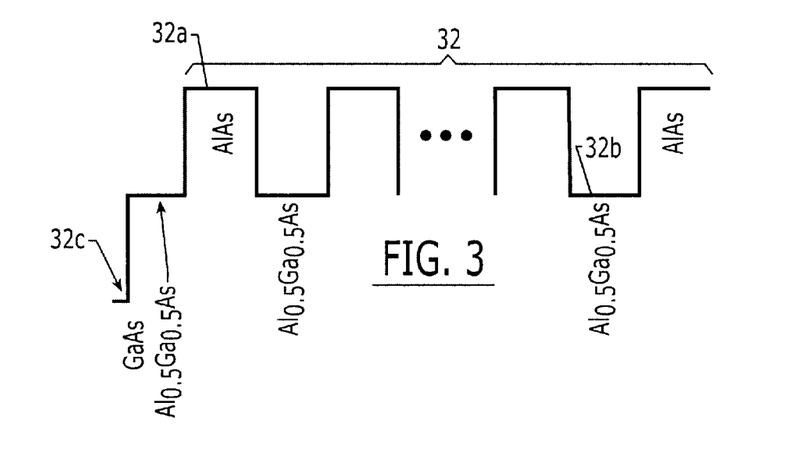
FIG. 3 is a schematic representation of the alternating $Ga_{0.5}Al_{0.5}As$ and AlAs layers of the output mirror of an electron beam pumped semiconductor laser screen according to one embodiment of the present invention.

The output mirror 32 consists of alternating layers of a first $Ga_xAl_{1-x}As$ composition 32a and a second $Ga_xAl_{1-x}As$ composition 32b that form a periodic, dielectric reflector having alternating layers with relatively high and low refractive indices, i.e., a Distributed Bragg Reflector (DBR). Typically, the output mirror is formed of alternating layers of AlAs and $Ga_{0.5}Al_{0.5}As$. In this regard, FIG. 3 provides a schematic representation of the output mirror in which the layers of AlAs are represented as plateaus or elevated portions and the layers of $Al_{0.5}Ga_{0.5}As$ are represented as valleys or recessed portions. Notably, the alternating layers that form the output mirror are semiconductor layers such that the output mirror can advantageously be fabricated by an epitaxial deposition process, thereby facilitating the efficiency and reliability with which the alternating layers can be formed as well as the quality of the resulting layers, i.e., thickness, uniformity, etc. The number of alternating layers and the respective thicknesses of the layers can be selected such that the resulting output mirror has a desired reflectivity for signals having a predefined wavelength, such as signals having the wavelength for which the semiconductor laser screen is designed to produce an output laser beam 14. By way of example, the output mirror of one advantageous embodiment includes 17 layers of $Al_{0.5}Ga_{0.5}As$ and 18 layers of AlAs arranged in an alternating fashion. By way of further example, the alternating layers of this advantageous embodiment are formed such that each $Al_{0.5}Ga_{0.5}As$ layer has a thickness of 486 angstroms and each AlAs layer has a thickness of 542 angstroms. As a result of the particular construction of the output mirror, the output mirror of this advantageous embodiment has a maximum reflectivity in excess of 90% for signals having a wavelength of 670 nanometers, i.e., signals in the red spectrum.

The semiconductor laser screen 12 can also include a layer 32c of GaAs to cap the output mirror 32 and prevent decay of the $Ga_xAl_{1-x}As$ layers 32b. The layer of GaAs that caps the output mirror typically forms a portion of a final layer of the output mirror. In the embodiment depicted in FIG. 3, for example, the final layer is primarily comprised of $Al_{0.5}Ga_{0.5}As$. As such, the final layer of the $Al_{0.5}Ga_{0.5}As$ and the layer of GaAs that caps the output mirror are formed such that the combined thicknesses of the layers is equal to the optical thickness of the other $Al_{0.5}Ga_{0.5}As$ layers. In the embodiment described above in which each $Al_{0.5}Ga_{0.5}As$ layer has a thickness of 486 angstroms, the final layer of $Al_{0.5}Ga_{0.5}As$ may have a thickness of 386 angstroms and the layer of GaAs that caps the output mirror may have a thickness of about 100 angstroms.

Figure 4A:
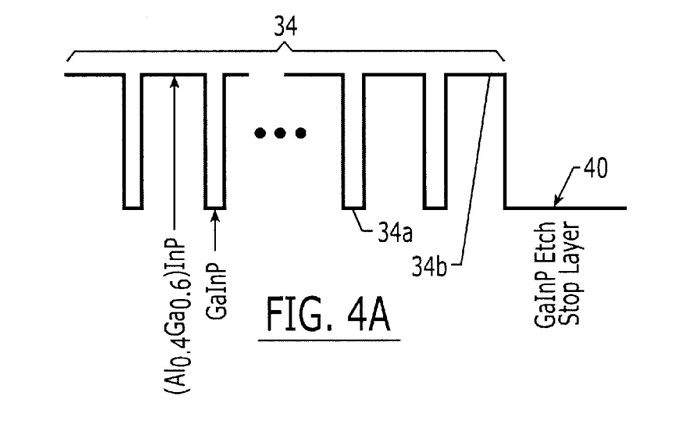
FIGS. 4A and 4B are schematic representations of alternate embodiments of the GaInP quantum wells and $Al_{0.4}Ga_{0.6}InP$ barrier layers of the active gain region and a GaInP etch stop layer of an electron beam pumped semiconductor laser screen according to the present invention.
Figure 4B:
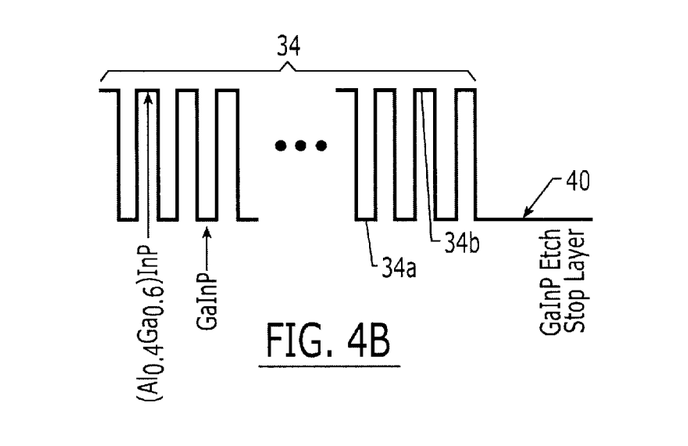

The active gain region 34 is disposed upon the output mirror 32 and, in the illustrated embodiment, upon the AlAs layer 32a that is opposite the GaAs layer 32c. The active gain region is designed to provide optical gain for signals having a desired wavelength, such as signals in the red spectrum. By way of example and not of limitation, the active gain region of one embodiment provides optical gain for signals having a wavelength of 620 nanometers to 680 nanometers. This gain is produced by the optically stimulated recombination of carriers, which were formed by electron beam bombardment. In order to efficiently lase in the red spectrum, the active gain region includes a plurality of quantum wells 34a formed of GaInP and a plurality of barrier layers 34b formed of $(Al_xGa_{1-x})$ InP, such as $Al_{0.4}Ga_{0.6}$InP, in preferred embodiments that are disposed in an alternating fashion. In this regard, FIGS. 4A and 4B illustrate the active gain regions of two advantageous embodiments, although others can be employed. In FIGS. 4A and 4B, the quantum wells are depicted as valleys or recessed portions and the barrier layers are depicted as plateaus or elevated portions.

Elastic strain may optionally be incorporated into the quantum wells 34a of the active gain region 34 depending on the growth parameters and the design of the structure. If strained quantum wells are to be incorporated, the strained quantum wells could be fabricated as described by U.S. Pat. No. 5,841,802 entitled Multiple Isolated, Strained Quantum Well Semiconductor Laser, the contents of which are incorporated herein.

The number and spacing of the quantum wells 34a are determined by the requirements for the gain region 34, such as the desired power level of the output laser beam 14, and the energy and, therefore, the penetration depth of the electron beam excitation. As shown in the embodiment of FIG. 4A, for example, the active gain region includes 58 quantum wells formed of GaInP that each have a thickness of 70 angstroms, and 59 barrier layers formed of $Al_{0.4}Ga_{0.6}$InP that each have a thickness of 260 angstroms. Alternatively, the embodiment of FIG. 4B, the active gain includes 147 quantum wells formed of GaInP that each have a thickness of 70 angstroms and 148 barrier layers formed of $Al_{0.4}Ga_{0.6}$InP that each have a thickness of 60 angstroms.

Figure 5:
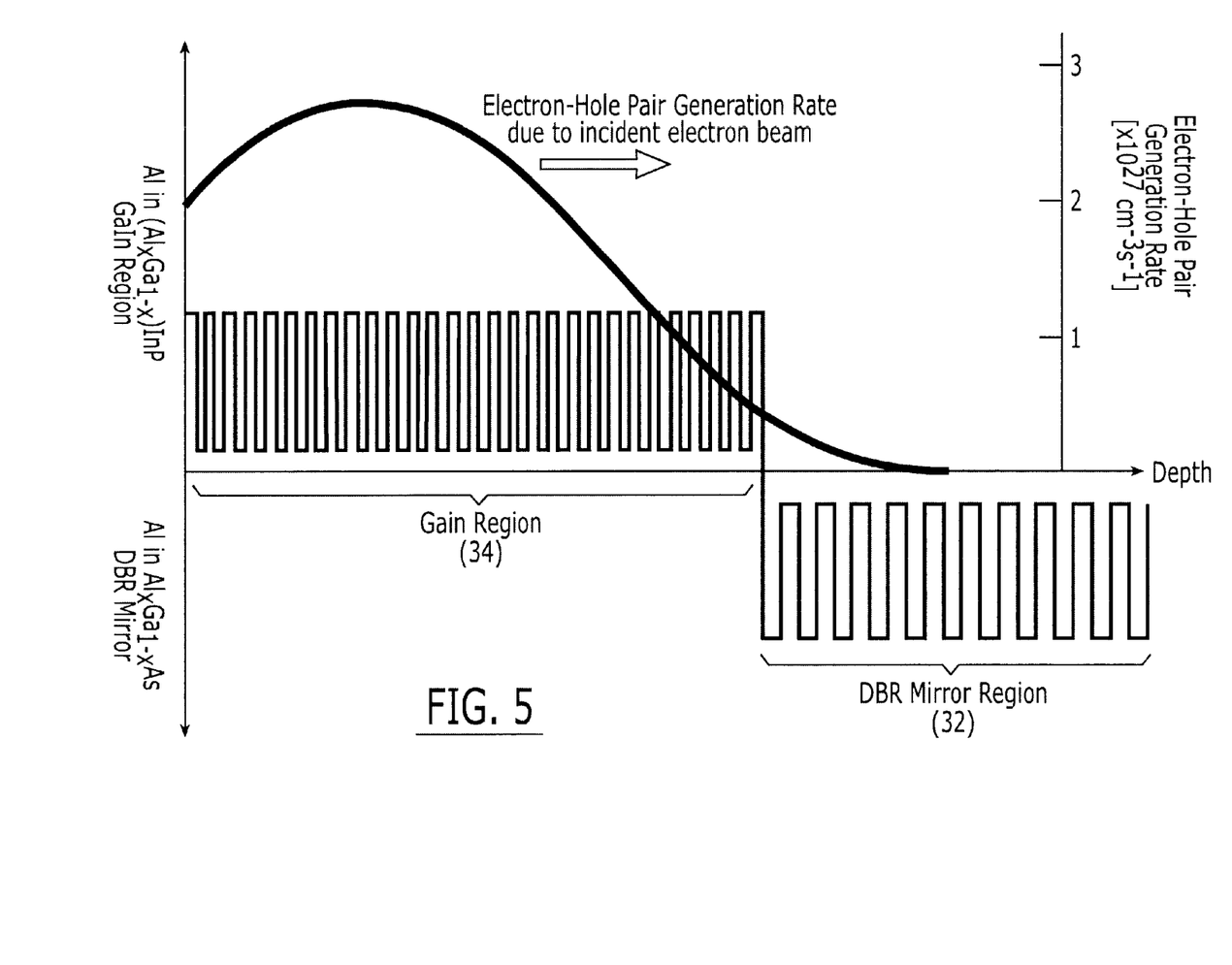
FIG. 5 is a graph of the electron-hole pair generation rate as a function of depth within a semiconductor laser screen relative to the respective thicknesses of the active gain region and the output mirror according to one embodiment of the present invention.

With respect to the penetration depth of the incident electron beam 11, the overall thickness of the active gain region 34 is preferably selected such that the incident electron beam causes the vast majority of the electron-hole pairs to be generated within the active gain region with only a few electron-hole pairs generated by the alternating layers of the output mirror 32 as depicted in FIG. 5. Accordingly, the active gain region is preferably relatively thin, such as depicted by the exemplary embodiments of FIGS. 4A and 4B, in order reduce the electron beam voltage that is required to institute lasing and to reduce the heat capacity of the laser screen 12, thereby reducing the heat generated during operation such that the semiconductor laser screen can be more easily cooled.

The thickness of the active gain region 34 is also preferably selected such that the length of the laser cavity defined by the output mirror 32 and the metallic mirror 36 is resonant for signals having a desired wavelength, that is, signals having the wavelength that are desirably emitted by the semiconductor laser screen 12. In this regard, the semiconductor laser screen is preferably designed such that the laser cavity is resonant for signals having a wavelength in the red spectrum. In order to appropriately define the cavity length without altering the design of the active gain region, the semiconductor laser screen may also include all or a part of an etch stop layer 40. The etch stop layer is formed on the active gain region, opposite the output mirror, and, as described below, is typically epitaxially deposited upon the active gain region. The etch stop layer is formed of $(Ga_xAs_{1-x})_yIn_{1-y}P$ and, in one embodiment, of the same material as the quantum wells, that is, GaInP, i.e., $Ga_{0.5}In_{0.5}P$. However, the etch stop layer is much thicker than a quantum well. For example, in the embodiment depicted in FIG. 4A, the etch stop layer has a thickness of 2150 angstroms, while in the embodiment of FIG. 4B, the etch stop layer has a thickness of 2050 angstroms. By incorporating an etch stop layer, the length of the laser cavity will now be defined as the cumulative length of the output mirror, the active gain region and the etch stop layer. As such, the thickness of the etch stop layer can be selected such that the resulting laser cavity has a desired length. Depending upon the composition of the etch stop layer and the laser wavelength, the thickness of the etch stop layer should also be selected so as to avoid strongly attenuating the output which could cause laser action to cease. For this reason, the etch stop layer is typically no thicker than 2500 angstroms. Preferably, if the etch stop layer is not removed, the etch stop layer should be transparent at the lasing wavelength. In addition to cooperating with the active gain region and the output mirror to define the cavity length such that the cavity length can be tailored to be resonant for signals having a desired wavelength, the etch stop layer is formed of a material that can serve as an etch stop during the chemical etching of an adjacent layer as described in conjunction with the fabrication of a semiconductor laser screen. This function is the main purpose of the etch stop layer.

The metallic mirror 36 forms the rear reflector for the laser cavity and provides a conductive return path, i.e., an anode, for the electron beam current, thereby preventing charging of the surface. The metallic mirror is formed from a metal with high reflectivity and low attenuation of the signals that will be emitted by the semiconductor laser screen 12. In one embodiment, for example, the metallic mirror includes a layer of silver (Ag). Alternatively, the metallic mirror can be formed of thin film of aluminum (Al) and, if it is desired that the Al mirror have increased reflectivity, a few (typically 2–6) periods of a dielectric stack, such as a $SiO_2/TiO_2$ stack, can be added thereto, thereby forming a hybrid metallic-dielectric mirror. In addition to providing increased reflectivity, the hybrid metallic-dielectric mirror can serve a cavity tuning purpose since the thickness of the dielectric layers contribute to the length of the laser cavity and can tune the cavity length to be resonant for signals having a desired wavelength. Additionally, the metallic mirror must be sufficiently thin to allow the majority of the electrons of the incident electron beam 11 to pass through the metallic mirror and into the active gain region 34. For example, a metallic mirror formed of Ag may have a thickness of a few hundred angstroms.

As a result of its construction, the semiconductor laser screen 12 of the present invention efficiently emits signals of a predetermined wavelength, namely, signals having a wavelength in the red spectrum, in response to an incident electron beam 11. Thus, by scanning the incident electron beam across the laser screen, the desired image can be presented by the semiconductor laser screen. As a result of its design, the semiconductor laser screen can also be fabricated in an efficient manner by utilizing semiconductor fabrication techniques which permit high quality layers to be epitaxially deposited that are uniform and consistent in thickness and composition, thereby enhancing the corresponding performance of the semiconductor laser screen. As such, a method for fabricating a semiconductor laser screen according to one aspect of the present invention is hereinafter described.

Figure 6A:
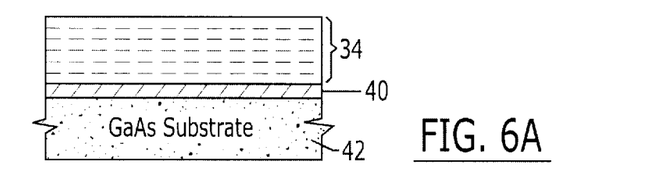
FIGS. 6A–6E are sequential cross-sectional views depicting the fabrication of an electron beam pumped semiconductor laser screen according to one embodiment of the present invention.
Figure 6B:
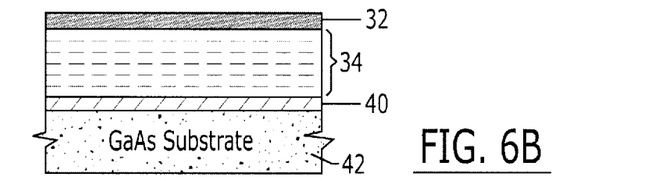

In this regard, FIGS. 6A through 6E illustrate a plurality of sequential stages during the fabrication of an electron beam pumped semiconductor laser screen 12 according to one advantageous embodiment of the present invention. As depicted in FIG. 6A, a substrate 42 is initially provided upon which the various layers of the active gain region 34 and the output mirror 32 will be epitaxially deposited. The substrate is typically a single crystal structure and, in the illustrated embodiment, is formed of GaAs, although the substrate can be formed of other materials, if so desired. The etch stop layer 40 is initially deposited, such as by epitaxial deposition, upon the substrate such that the etch stop layer is lattice matched to the substrate. As described above, the etch stop layer is formed of $(Ga_{1-x}Al_x)_yIn_{1-y}P$, such as GaInP, and if not removed during processing, the etch stop layer should have a thickness selected such that the length of the laser cavity that will be thereafter formed will be resonant for signals having a desired wavelength, such as signals having a wavelength in the red spectrum.

Thereafter, the active gain region 34 is formed by epitaxially depositing alternating barrier layers 34b and quantum wells 34a formed of $Al_xGa_{1-x}InP$ and GaInP, respectively, and, more particularly, of $Al_{0.4}Ga_{0.0}InP$ and GaInP, respectively, as described above and as depicted in FIG. 6A. Although not necessary for the practice of the present invention, the active gain region and, in particular, the barrier layers can include As, if desired. As a result of the selection of the materials, the layers of the active gain region will be lattice matched to the etch stop layer 40 and, in turn, to the underlying substrate 42. Moreover, the resulting semiconductor laser screen 12 will advantageously lase in the red spectrum. Although not further described herein, the quantum well can be strained, if so desired. Thereafter, the output mirror 32 is deposited upon the active gain region. In particular, alternating layers of a first $Ga_xAl_{1-x}As$ composition 32a and a second $Ga_xAl_{1-x}As$ composition 32b, such as alternating layers of AlAs and $Al_{0.5}Ga_{0.5}As$, are epitaxially deposited upon the active gain region until an output mirror having the desired reflectivity for signals having a desired wavelength has been defined. See FIG. 6B. As described above, the output mirror can be capped with a layer of GaAs.

Figure 6C:
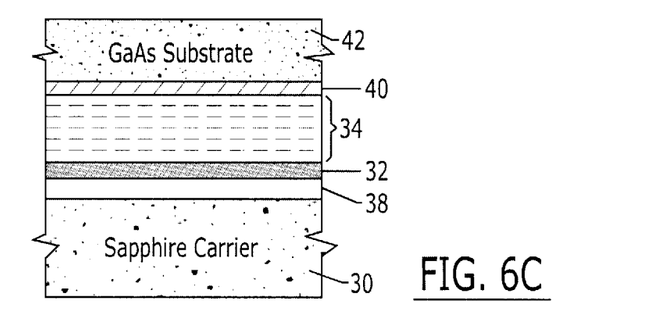
Figure 6D:
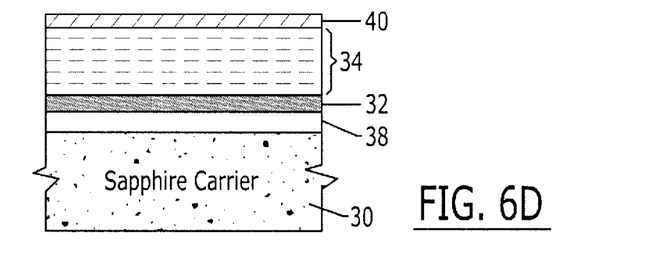

As depicted in FIG. 6C, this intermediate structure is then bonded to a carrier 30. As depicted, the carrier can be formed of sapphire, although the carrier can be formed from other optically transparent wafers, if so desired. In the illustrated embodiment, this intermediate structure is bonded to the carrier by means of an optically transparent adhesive 38. Alternatively, this intermediate structure can be fusion bonded to the carrier, if so desired. Thereafter, the substrate 42 is removed as depicted in FIG. 6D. In this regard, the majority of the substrate is removed by mechanically polishing. While the entire substrate can be removed by mechanical polishing, the final portion of the substrate proximate the etch stop layer 40 is typically chemically etched such that more precise control of the substrate removal can be maintained. Typically, the etching is completed upon reaching the etch stop layer which also serves as an etch stop. However, the etch stop layer or a portion thereof can be removed by subjecting the etch stop layer to a different chemical etchant in order to avoid unwanted cavity loss. In most instances, however, at least a portion of the etch stop layer will remain. In instances in which a portion of the etch stop layer is removed, the etch stop layer should initially be formed so as to have a greater thickness than desired such that the subsequent etching of the etch stop layer will result in an etch stop layer that, in combination with the active gain region, defines a resonant cavity of the desired length.

Figure 6E:
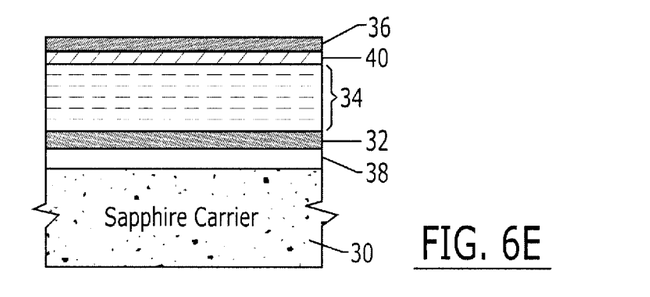

Once the substrate 42 has been removed, the metallic mirror 36 is deposited to form the rear reflector as well as the anode. In one embodiment, the metallic mirror is formed of Ag and is deposited by physical vapor deposition, such as evaporation, sputtering or the like. As such, the resulting semiconductor laser screen 12 defines a laser cavity between the output mirror 32 and the metallic mirror that has a length selected such that the laser cavity is resonant for signals having a desired wavelength, such as signals having a wavelength within the red spectrum. By utilizing semiconductor fabrication techniques including the epitaxial deposition of the barrier layers 34$a$ and the quantum wells 34$a$ of the active gain region 34 and the alternating layers of the output mirror and the etch stop layer 40, each layer can be fabricated in an efficient and cost effective manner. In addition, each layer can be formed in a uniform manner so as to have the desired thickness and to have few, if any, defects, thereby avoiding variations in the image presented by the semiconductor laser screen that might otherwise distort the image. Thus, the resulting semiconductor laser screen should provide high quality images in a consistent manner. As a result of its construction, the semiconductor laser screen also may not consume as much power as conventional laser screens so as to permit operation at or near room temperature and to provide a relatively long operational lifetime.

Many modifications and other embodiments of the invention will come to mind to one skilled in the art to which this invention pertains having the benefit of the teachings presented in the foregoing descriptions and the associated drawings. For example, although specific materials and material combinations are provided for purposes of example, the invention can be extended to other material systems and to semiconductor laser screens operating at other wavelengths, if so desired. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A semiconductor laser screen comprising:
   a carrier;
   an output mirror affixed to said carrier, said output minor comprised of a plurality of alternating layers of a first $Ga_{1-x}Al_xAs$ composition and a second $Ga_{1-x}Al_xAs$ composition;
   a multi quantum well active gain region on said output mirror, said multi quantum well active gain region comprising a plurality of gain regions of GaInP separated by barrier layers of $(Al_{1-x}Ga_{1-x})InP$ for lasing in the red spectrum;
   an etch stop layer of $(Ga_{1-x}Al_x)_yIn_{1-y}P$ on said multi quantum well active gain region opposite said output mirror; and
   a metallic mirror on said etch stop layer which cooperates with said output minor to define a laser cavity, said metallic mirror capable of permitting electrons to penetrate therethrough in order to pump the gain regions of said multi quantum well active gain region,
   wherein said multi quantum well active gain region is in direct contact with at least one of said output minor and said etch stop layer.

2. A semiconductor laser screen according to claim 1 wherein said output mirror is comprised of alternating layers of AlAs and $Ga_{0.5}Al_{0.5}As$.

3. A semiconductor laser screen according to claim 1 wherein said metallic mirror is a hybrid metallic-dielectric mirror comprised of a plurality of dielectric layers and a metal layer.

4. A semiconductor laser screen according to claim 1 wherein said etch stop layer is comprised of GaInP.

5. A semiconductor laser screen according to claim 1 wherein said carrier is optically transparent.

6. A semiconductor laser screen according to claim 1 wherein said output mirror is affixed to said carrier with a transparent optical adhesive.

7. A semiconductor laser screen according to claim 1 further comprising a layer of GaAs between said output mirror and said carrier.

8. A semiconductor laser screen according to claim 1 wherein said multi quantum well active gain region is comprised of said barrier layers of $Al_{0.4}Ga_{0.6}InP$.

9. An electron beam pumped semiconductor laser comprising:
   a semiconductor laser screen comprising:
     a carrier;
     an output mirror affixed to said carrier, said output mirror comprised of a plurality of alternating layers of a first $Ga_{1-x}Al_xAs$ composition and a second $Ga_{1-x}Al_xAs$ composition;
     a multi quantum well active gain region on said output minor, said multi quantum well active gain region comprising a plurality of gain regions of GaInP separated by barrier layers of $(Al_xGa_{1-x})InP$;
     an etch stop layer of $(Ga_{1-x}Al_x)_yIn_{1-y}P$ on said multi quantum well active gain region opposite said output mirror; and
     a metallic mirror on said etch stop layer,
     wherein said multi quantum well active gain region is in direct contact with at least one of said output mirror and said etch stop layer; and
   an electron beam source for generating an electron beam that impinges upon said semiconductor laser screen, wherein at least some electrons of the electron beam penetrate said metallic minor and pump the gain regions of said multi quantum well active gain region in order generate lasing in the red spectrum.

10. An electron beam pumped semiconductor laser according to claim 9 wherein said output mirror is comprised of alternating layers of AlAs and $Ga_{0.5}Al_{0.5}As$.

11. An electron beam pumped semiconductor laser according to claim 9 wherein said metallic mirror is a hybrid metallic-dielectric mirror comprised of a plurality of dielectric layers and a metal layer.

12. An electron beam pumped semiconductor laser according to claim 9 wherein said etch stop layer is comprised of GaInP.

13. An electron beam pumped semiconductor laser according to claim 9 wherein said carrier of said semiconductor laser screen is optically transparent.

14. An electron beam pumped semiconductor laser according to claim 9 wherein said output mirror of said semiconductor laser screen is affixed to said carrier with a transparent optical adhesive.

15. An electron beam pumped semiconductor laser according to claim 9 further comprising a layer of GaAs between said output mirror and said carrier.

16. An electron beam pumped semiconductor laser according to claim 9 wherein said multi quantum well active gain region of said semiconductor laser screen is comprised of said barrier layers of $Al_{0.4}Ga_{0.6}InP$.

17. An electron beam pumped semiconductor laser according to claim 9 further comprising an evacuated tube in which said semiconductor laser screen and said electron beam source are positioned at opposite ends thereon.

18. An electron beam pumped semiconductor laser according to claim 9 wherein a deflector is positioned between said semiconductor laser screen and said electron beam source for controllably deflecting said electron beam.

* * * * *

UNITED STATES PATENT AND TRADEMARK OFFICE
CERTIFICATE OF CORRECTION

PATENT NO. : 6,556,602 B2
DATED : April 29, 2003
INVENTOR(S) : Rice et al.

It is certified that error appears in the above-identified patent and that said Letters Patent is hereby corrected as shown below:

Title page,
Item [73], Assignee, "Assignee" should read -- Assignees --;
After "The Boeing Company, Seattle, WA (US)" insert -- Honeywell International Inc., Morristown, NJ (US) --.

Column 9,
Lines 41, 54 and 59, "minor" should read -- mirror --;
Line 48, "$(Al_{1-x}Ga_{1-x})$" should read -- $(Al_xGa_{1-x})$ --.

Column 10,
Lines 21 and 33, "minor" should read -- mirror --;
Line 35, after "order" insert -- to --.

Signed and Sealed this

Ninth Day of September, 2003

JAMES E. ROGAN
*Director of the United States Patent and Trademark Office*